United States Patent [19]

Stillie

[11] Patent Number: 4,693,529

[45] Date of Patent: Sep. 15, 1987

[54] ELASTOMERIC MOTHER-DAUGHTER BOARD ELECTRICAL CONNECTOR

[75] Inventor: Donald G. Stillie, Winston-Salem, N.C.

[73] Assignee: AMP Incorporated, Harrisburg, Pa.

[21] Appl. No.: 846,325

[22] Filed: Mar. 31, 1986

[51] Int. Cl.$^4$ ............................................. H01R 9/09
[52] U.S. Cl. ..................................... 439/67; 439/493
[58] Field of Search ............ 339/17 F, 17 M, 17 LM, 339/61 M, 59 M, 176 MF, DIG. 3

[56] References Cited

U.S. PATENT DOCUMENTS

| | | | |
|---|---|---|---|
| 3,924,915 | 12/1975 | Conrad | 339/17 F |
| 4,057,311 | 11/1977 | Evans | 339/17 M |
| 4,552,420 | 11/1985 | Eigenbrode | 339/17 M |

Primary Examiner—Neil Abrams
Attorney, Agent, or Firm—Eric J. Groen

[57] ABSTRACT

An electrical connector assembly comprises a plastic body member and an elastomeric insert, and a flexible film surrounding the cylindrical body portion; the film having a plurality of electrical conductors thereon. The conductors are defined on the exterior surface of the film which is affixed around a portion of the cylindrical body member. The elastomeric insert member has nodes extending outwardly from the surfaces of the cylindrical portion. The electrical conductors on the flexible film establishes an interconnection to conductive pads on right angle mounted substrates such as printed circuit boards.

15 Claims, 10 Drawing Figures

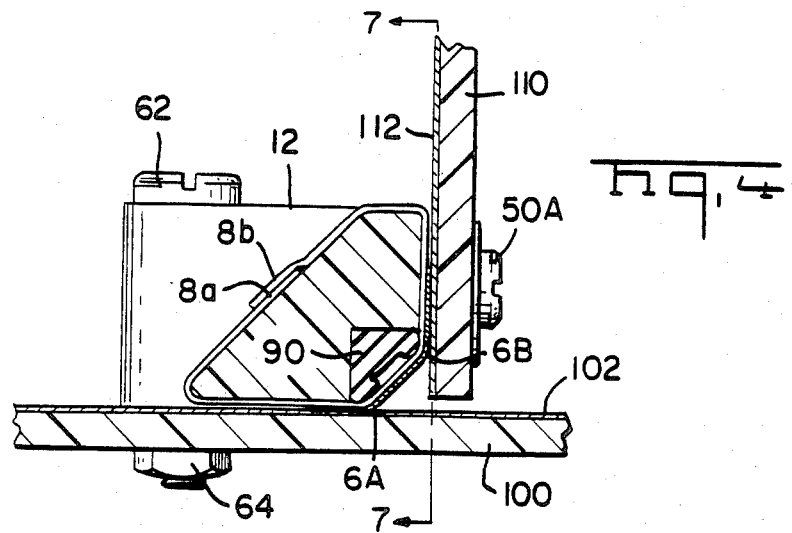
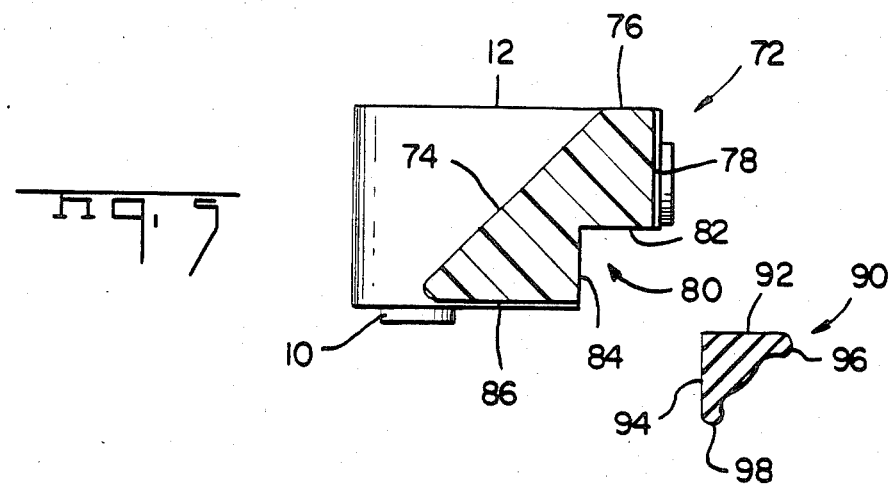
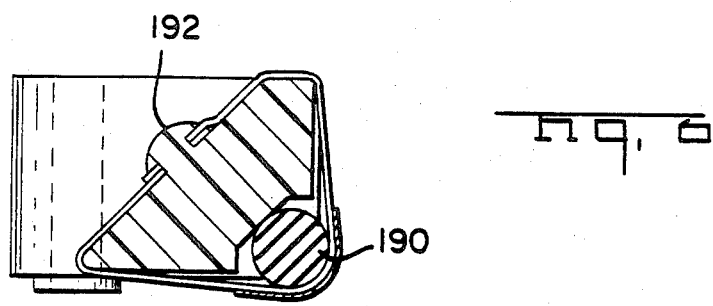

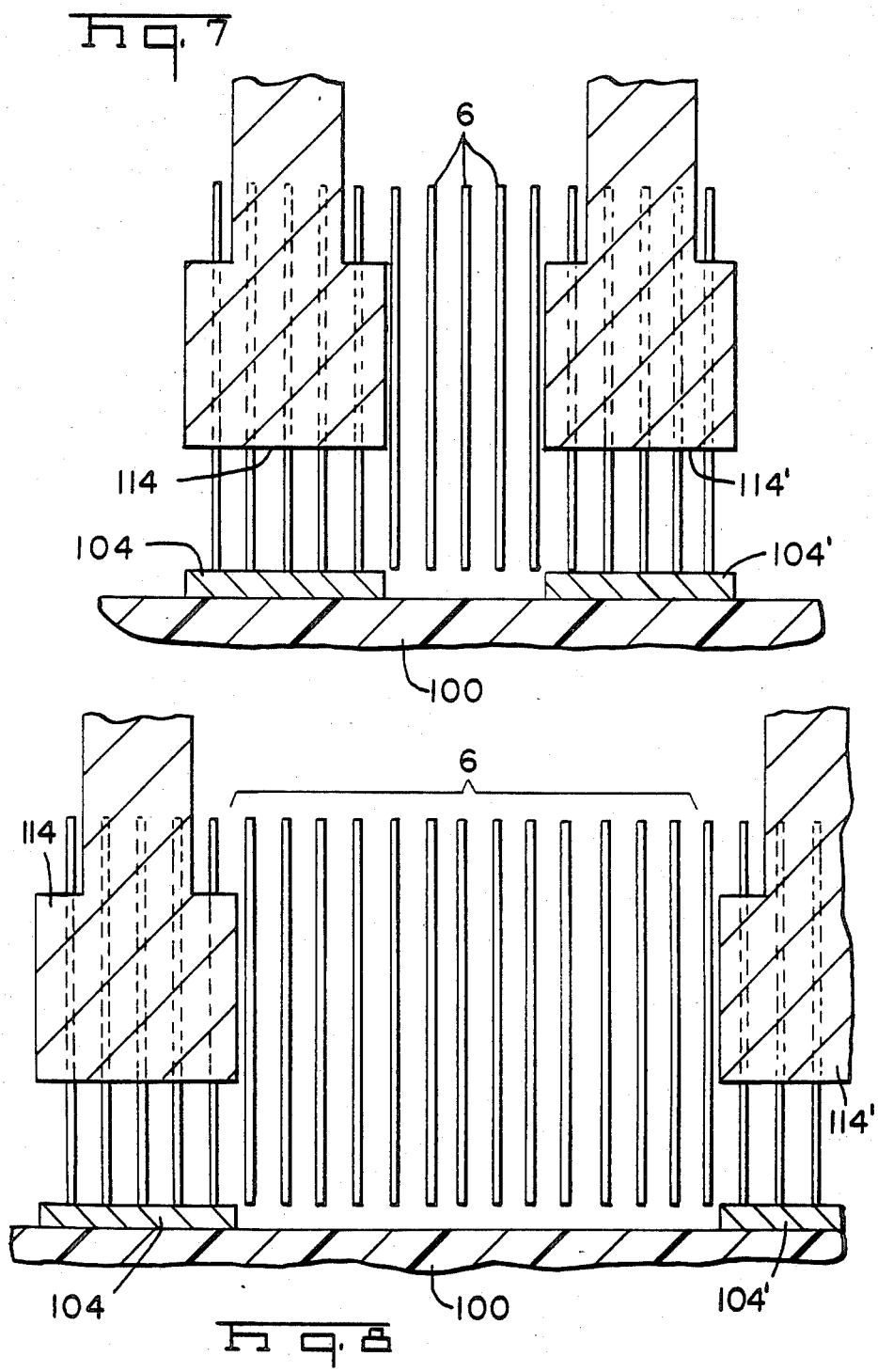

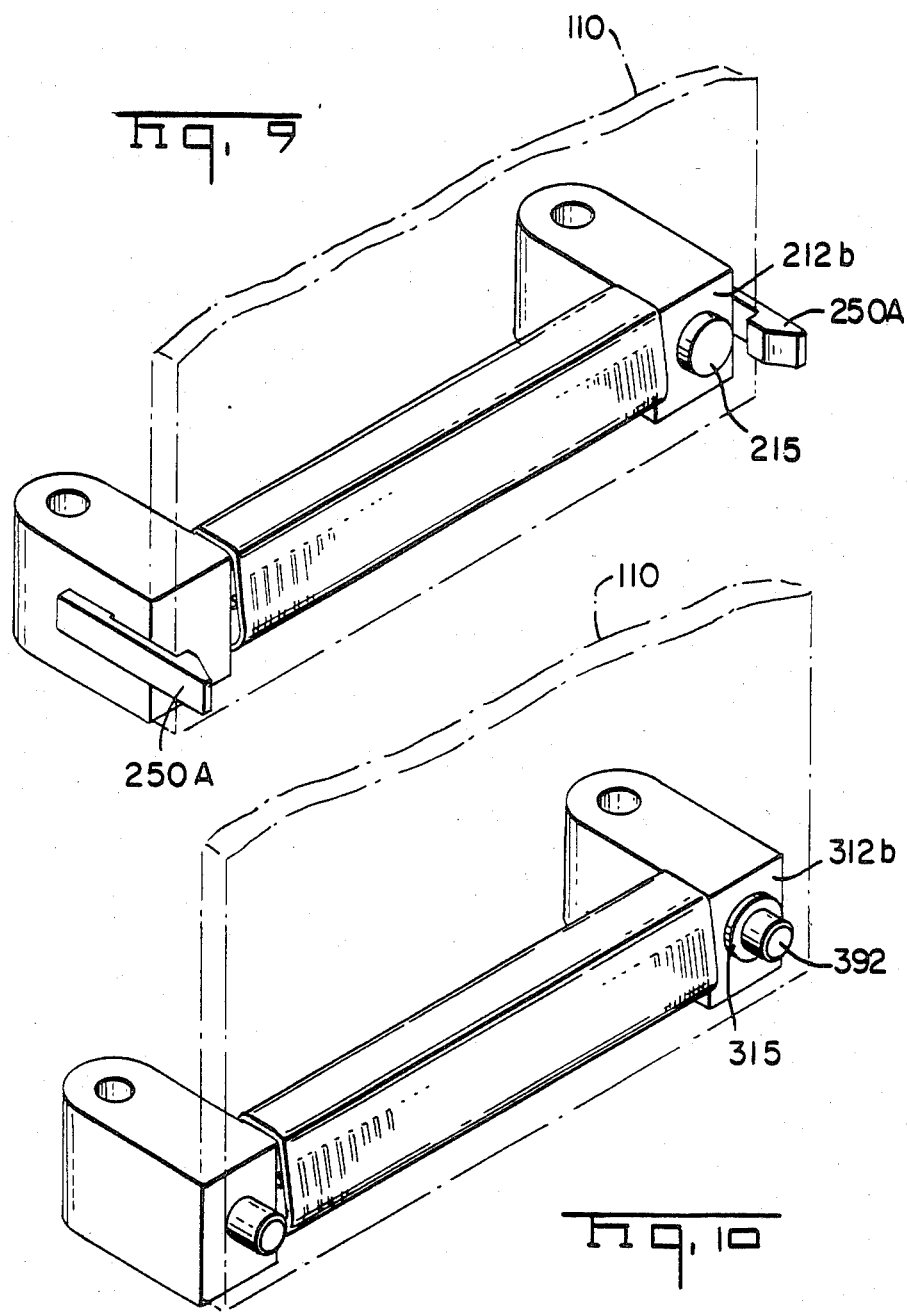

ELASTOMERIC MOTHER-DAUGHTER BOARD ELECTRICAL CONNECTOR

FIELD OF THE INVENTION

This invention relates to an electrical connector for interconnecting circuitry on a substrate and more particularly it relates to an electrical connector which can be positioned on a mother board and for connecting to it a daughter board to interconnect corresponding aligned paths on the printed circuit boards.

DESCRIPTION OF THE PRIOR ART

U.S. Pat. No. 3,985,413 discloses a miniature electrical connector which can be positioned between parallel spaced apart substrates, such as printed circuit boards to interconnect circuitry on each of the printed circuit boards. The connector consists of a generally cylindrical elastomeric body having a thin conventionally stable flexible film wrapped around the elastomeric body. Circuit traces are defined on the flexible film and face outwardly. When the elastomeric body is compressed between the two substrates or printed circuit boards, the elastomeric body supplies sufficient compression force to establish an electrical connection between exposed paths on the printed circuit boards.

The electrical connector disclosed in U.S. Pat. No. 3,985,413 employs a film polymeric material which is wrapped around the elastomeric body. The free ends of the film are joined together to maintain a film in surrounding relationship to the elastomeric body. The film is not attached directly to the connector body, thus permitting relative movement therebetween when the body is placed under compressive loads. U.S. Pat. No. 3,985,413 only discloses the elastomeric connector and does not describe a manner in which that elastomeric connector is mounted to interconnect separate circuit components, such as perpendicualrly mounted printed circuit boards. In use, that miniature electrical connector must be positioned within an insulating housing which is in turn attached to the electrical components. When used to interconnect printed circuit boards, that miniature elastomeric connector is positioned within a longitudinally extending recess in an insulating housing and the insulating housing is attached directly to the printed circuit boards. Although the circuit traces on the exterior of that miniature electrical connector have a width less than the spacing of conventional contact paths of printed cicuit boards, in order to prevent easy alignment, it is still necessary to rely upon the housing to position the connector relative to the printed circuit board.

There are several drawbacks to the use of a separate connector of this type in conjunction with a separate housing. Foremost among these disadvantages is the additional manufcaturing costs due primarily to the necessity of actual assembling the elastomeric connector in the housing. An additional problem which has been encountered with connectors of this type is that such connectors have not heretofore lent themselves to establishing an interconnection between perpendicularly mounted printed circuit boards.

Another example of an electrical connector intended for interconnecting printed circuit boards is disclosed in U.S. Pat. No. 4,057,311. That connector also employs a thin film having circuit traces disposed on its exterior and uses elastomeric members to establish contact pressure when the compressive forces apply thereto. The miniature electrical connector disclosed in that patent employs a central rigid body having a trough-like recess in which the elastomeric members are positioned. The thin film circuitry is, however, positioned along the rigid body and is to be placed in position by a plurality of elastomeric members spaced side by side in a common recess and interconnects two spaced printed circuit boards in parallel relationship. It can be appreciated that the assembly costs encountered with elastomeric connectors of more conventional construction would be magnified by the electrical connectors shown in U.S. Pat. No. 4,057,311, at least in part because of the large numbers of separate parts which must be employed. Furthermore, this connector has not been adapted for use with perpendicularly mounted printed circuit boards.

U.S. Pat. No. 4,552,420 discloses a right angled connector for interconnecting circuitry on perpendicularly mounted printed circuit boards. However, each conductive trace on the flexible dielectric of the connector corresponds to a respective circuit pad on either the mother board or daughter board. Thus, one given connector can only interconnect circuitry that is on the same centerline spacing as the centerline spacing of the conductive traces on the flexible material. A change in centerline spacing on the mother board or daughter board requires a different connector having a corresponding centerline spacing on the flexible material.

SUMMARY OF THE INVENTION

The preferred embodiment of the invention comprises an electrical connector for interconnecting circuitry on at least one substrate to a corresponding circuitry, either on a separate substrate or a separate electrical component. The substrate has conductive elements such as contact pads disposed on one surface thereof as part of the circuitry on the substrate. These pads can be inteconnectd to conductive traces also located on the surface of the substrate or printed circuit board. Alternatively these pads can be interconnected to other circuitry on the substrate, such as circuits on a multilayer printed circuit board in which the circuits are positioned between the insulating layers.

The preferred embodiment of the invention comprises an electrical connector in a mother-daughter board configuration, the connector secured to the mother board and the daughter board secured to the connector. The electrical connector has a body which is formed of a plastic material having at least one cylindrical portion which is integral with the base portions on each end of the cylindrical portion. In the preferred embodiment of this invention, the cylindrical portion has a trapezoidal cross section. On at least one location of the connector, preferably on the base portion, is included an alignment boss which mates with a hole in the circuit board which aligns the circuit paths on the mother board with the circuit paths on the daughter board.

The preferred embodiment of the invention also includes a insert-receiving cavity, the insert being made of an elastomeric material. In the preferred embodiment, the elastomeric insert is triangular in cross section having adjacent sides longer than the mating sides in the insert-receiving cavity. Thus, a portion of the insert corner or node protruds beyond the adjacent face. The insert is designed for perpendicularly mounted printed circuit boards and has the ability to produce a normal force on each of the perpendicularly mounted boards, using a single insert.

The preferred embodiment of the invention then includes a polymeric film having conductive traces disposed on the surface of the film, the film being wrapped around the insert and the body portion, and affixed to the body portion. The conductive traces on the film are disposed on the film with a much smaller center line than the conductive paths on the printed circuit boards. The conductors can be disposed in registry with the conductive elements or conductive paths on the substrate or on the substrates.

The subject invention relates to a low cost connector for interconnecting perpendicularly mounted printed circuit boards. The connector has the ability to align both the mother board and the daughter board to the connector, laterally aligning the circuitry on the two substrates. The connector has a rigid plastic body and an elastomeric insert producing predictable placement of the substrates relative to the connector.

BRIEF DESCRIPTION OF THE DRAWINGS

FIG. 3 is a cross-sectional view taken through lines 3—3 of FIG. 1 showing the boards exploded away from the connector.

FIG. 4 is similar to the cross section of FIG. 3 showing the mother board and daughter board secured to the connector.

FIG. 5 is a diagrammatical view showing a cross section of the connector body portion with the insert exploded away from the insert-receiving cavity.

FIG. 6 is a cross-sectional view of the body portion showing an alternate configuration for the insert.

FIG. 8 is a diagrammatical view similar to that of FIG. 7 showing the conductive pads further spaced apart.

FIG. 9 is a perpective view of an alternate embodiment showing a further means of attaching the daughter board to the connector.

FIG. 10 is a perspective view of a further alternate embodiment showing another method of securing the daughter board to the connector.

DETAILED DESCRIPTION OF THE PREFERRED EMBODIMENT

Figure 1:
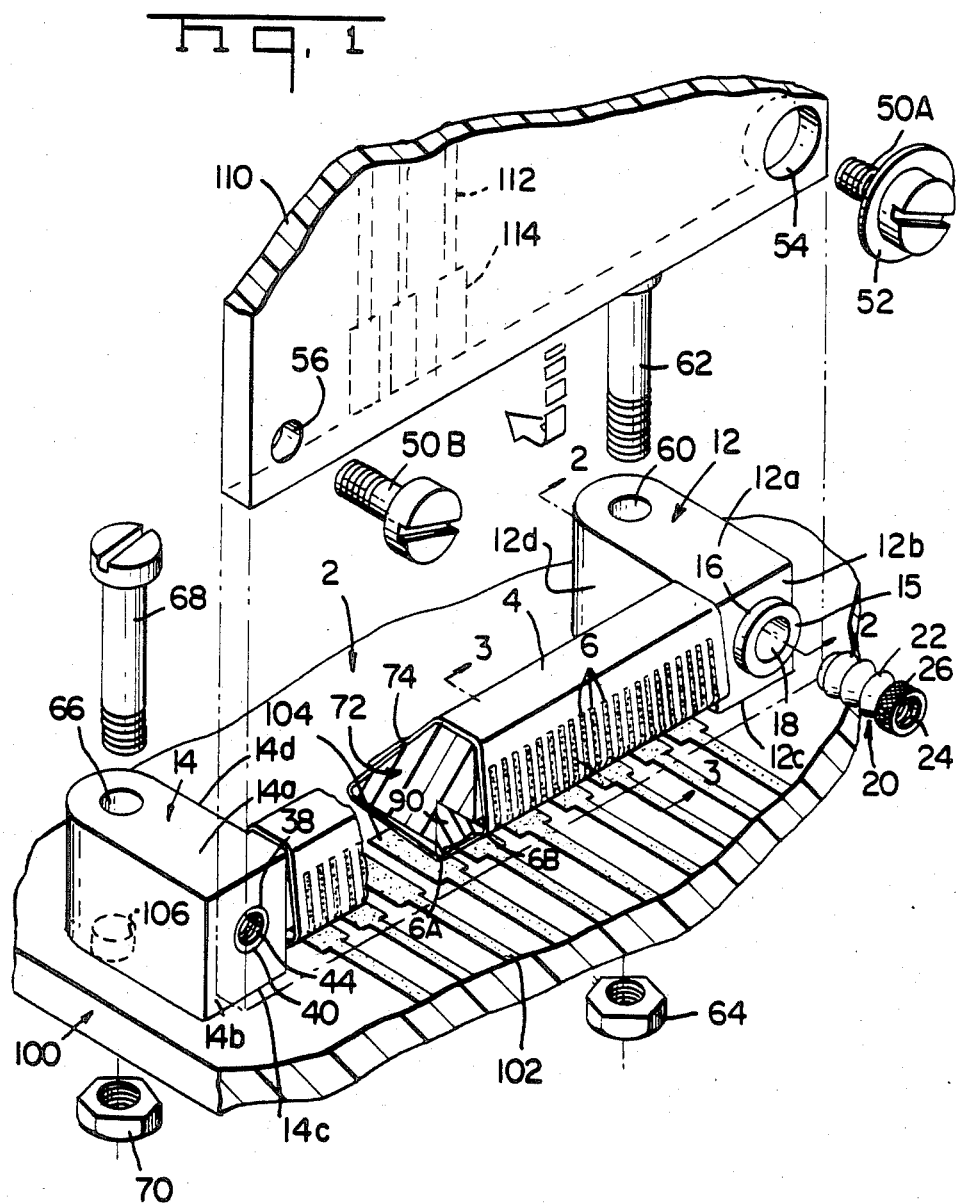
FIG. 1 is a perspective view of a connector in accordance with the preferred embodiment of the invention.

The preferred embodiment of the electrical connector of this invention comprises a body molded of a plastic material, such as Valox, a registered trademark of the General Electric Company, consisting of a cylindrical central portion 72 and base portions 12 and 14 on either end. The connector central body portion 72 has an insert-receiving recess 80 (FIG. 5) for receiving insert 90. The flexible film 4 has a conductive traces 6 thereon, and is wrapped around the central body portion 72 and insert 90, and is secured to the body portion 72. The connector has two base portions 12 and 14 molded integrally with the central body portion 72, and has means for attaching the connector to a mother board 100. The connector base portions 12, 14 further comprise means for attaching the daughter board 110 to the connector. The central insulative film can comprise any of a number of conventional polymeric films such as a polyimide-amide film. The conductive traces 6 can comprise etched metallic traces such as etched copper traces deposited on the exterior of the film or can comprise conductive ink traces screen printed onto the exterior of the film. The film conductor laminate can also be fabricated in a conventional manner by casting a polymeric film onto one surface of a conductive shield and then selectively etching the conductor 6.

Referring more specifically to FIG. 1, the connector comprises central body portion 72 molded integrally with the right base portion 12 and with the left base portion 14. The base portion 12 has a top surface 12a, a front surface 12b, a lower surface 12c, and an inside surface 12d. Projecting from surface 12b is an alignment boss 15 having an outer diameter surface 16. Insert-receiving hole 18 projects into the base portion 12 and through the alignment boss 15. Projecting through the base portion 12 from the top surface 12a through the bottom surface 12c is hole 60 for receiving a bolt, such as 62. A threaded insert member, shown exploded from hole 18 in FIG. 1, has outer ribs 22, a knurled outer diameter 26 and internal threads 24.

The left body portion 14 has an upper surface 14a, a front surface 14b and a lower surface 14c, and an inside surface 14d. Projecting into the body portion 14 is insert-receiving hole 38. Also projecting through the central body portion 14 from surface 14a and 14c is hole 66 for receiving a bolt such as 68.

Extending between body portions 12 and 14 is a cylindrical portion of trapezoidal configuration. Central portion 72, shown in cross section in FIG. 5, includes rear slanting surface 74, top surface, front surface 78 and lower surface 86. the central portion 72 further comprises an insert receiving recess 80 which is formed by the top surface 82 and the back surface 84. The connector 2 further comprises an elastomeric insert 90 formed in a generally triangular shape, having top surface 92 and back surface 94. The insert member 90 further comprises nodes 96 and 98.

Connector 2 further comprises a polymeric film 4 having conductive traces 6 disposed thereon. The polymeric film 4 is wrapped around the conductor central portion 72 and is secured thereto. It should be understood that the conductive traces as shown in FIG. 1 are for illustrative purposes only, that is, the centerline spacing of the conductive traces may be as small as 0.0050 inches, whereas the centerline spacing of the conductive paths on the printed circuit boards may be 0.050 inches.

A mother board 100 which the connector 2 will be secured to has conductive tabs 104 and conductive traces 102. Printed circuit board 100 further includes holes 106 (shown in phantom in FIG. 1) and alignment boss receiving hole 108 (FIG. 3). Daughter board 110 includes conductive pads 114 and conductive traces 112, and further inludes hole 56 and alignment boss receiving hole 54 for receiving boss 15.

The central body portion 72 and the base portions 12 and 14 are first molded from a rigid plastic material, such as Valox, the central body portion 72 extending between the body portions 12 and 14 from surface 12d of body portion 12 to surface 14d of body portion 14. As molded, the molded part also includes bosses 10 and 15, and holes 60, 66, 18 and 38. The connector 2 is also molded to produce square surfaces 14a, 14b, 14c, 12a, 12b, and 12c.

Figure 2:
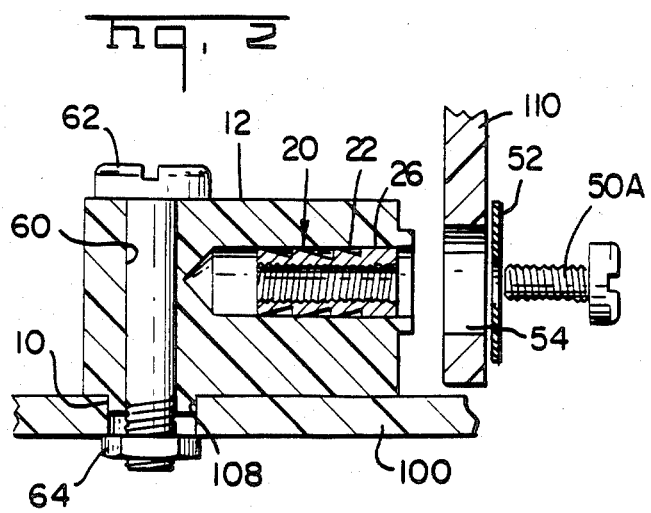
FIG. 2 is a cross-sectional view taken through lines 2—2 of FIG. 1.

The threaded inserts 20 and 40 may then be installed in their respective receiving holes 18 and 38, and mounted flush with surfaces 12b and 14b, respectively. The inserts 20 and 40 are inserted ultrasonically causing the plastic to heat up in the area of the ribs 22 (FIG. 2) and further causing the plastic to flow around the ribs 22, firmly seating the inserts in the respective holes.

Prior to surrounding the plastic cylindrical body 72 with the conductive film 4, the elastomeric insert 90 is placed in the receiving recess 80, surface 92 abutting surface 82 of the recess 80 and surface 94 of the insert abuttng surface 84 of the recess 80, as shown in FIG. 5. As the length of surfaces 92 and 94 of the insert 90 are greater than that of the surfaces 82 and 84 of the body, upon placing th insert into the receiving recess 80, the insert node 96 projects outwardly from surface 78 of the body portion and insert node 98 projects outwardly from the surface 86, as shown in FIG. 6.

The film conductor laminate 4 which serves as the actual interconnect between substrates, is then positioned in surrouding relationship to the cylidrical body portion 72. In the preferred embodiment of this invention, a first end 8a of the insulative film 8 is attached to one face of the cylindrical body portion 72 by conventional adhesive extending along the length of leading edge 8a. The opposite edge 8b is then attached to the exterior of the edge 8a, again using the same type of adhesive. A pressure sensitive, polymerized silicone adhesive is used to provide adherence to the cylindrical body portion 72. The film conductor laminate is aligned such that the conductive traces are perpendicularly disposed relative to the axial centerline of the cylindrical body portion 72. With the film conductor laminate aligned in this manner, the individual conductive traces will be aligned to contact oppositely facing aligned conductor pads, such as aligned paths 104 and 114, on perpendicularly mounted printed circuit boards, as shown in FIG. 1.

The conductive traces on the film laminate are defined such that a plurality of traces will contact each conductor pad. Although the conductive pads on the mother and daughter board must have equal centerline spacings, with a plurality of conductive traces on the film substrate dedicated to a single conductor pad on the printed circuit board, the connector may be utilized for interconnecting conductive pads on substrates regardless of the centerline spacing of the conductor pads on the pair of interconnected substrates. All that is required to interconnect the substrates is that the conductive pads on the mother board and the daughter board are laterally aligned.

In the preferred embodiment of the ivnention then, a typical flexible film substrate 4 has conductive traces 0.0025 inches wide on 0.005 inches centerlines, or 0.003 inches wide on 0.007 inch centerline, although other sidths and spacings of conductive traces are possible. A typical printed circuit board has 0.025 inch wide conductive pads on 0.050 inch centerlines, but could also be 0.025 inches wide on 0.100 inch centerliines. The subject connector can accommodate any centerline spacing on each combination mother-daughter board, provided the conductive pads on the printed circuti boards are laterally aligned.

Figure 7:
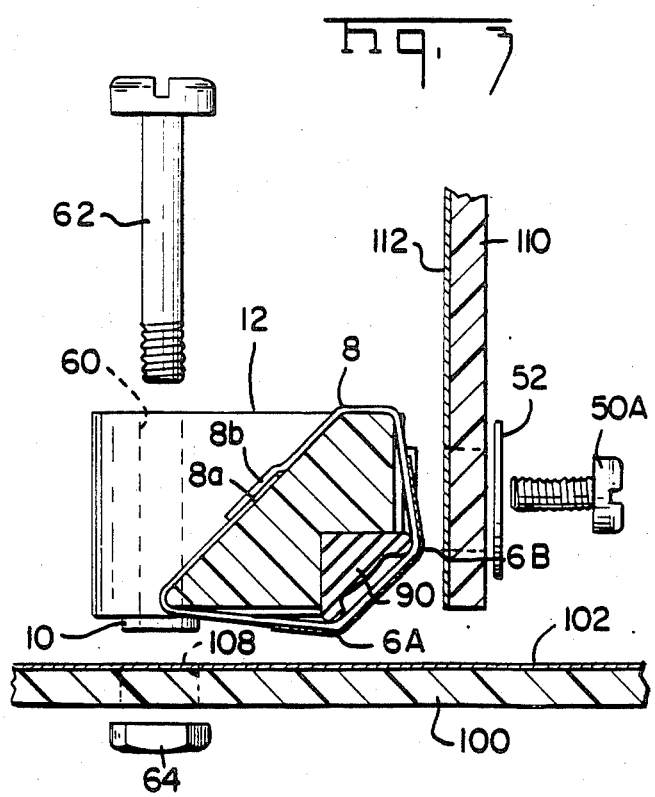
FIG. 7 is a diagrammatical view taken through lines 7—7 of FIG. 4, with the conductive pads closely spaced together.

Referring to FIG. 7, the mother and daughter board are shown with the conductive pads 104 to 114 and 104' and 114' laterally aligned. If the conductive pads are closely spaced to one another, a plurality of conductive traces 6 redundantly interconnect the conductive pads 104 to 114 and 104' to 114', respectively, leaving only a few traces 6 between the pads 114, 114', as shown ini FIG. 7. However, when the conductive pads on the mother and daughter boards are further spaced apart, as shown in FIG. 8, the same connector having the same flexible film substrate 4, may still be utilized to interconnect the conductive pads 104 to 114, and 104' to 114'. However, instead of a few conductive traces 6 spaced between the conductive pads, a plurality of traces 6 are left spaced between the conductive pads 104, 104', and 114, 114', as shown in FIG. 8.

In the preferred embodiment of this invention, the insulating film 8 is not affixed to the cylindrical body portion 72 along its entire surface, that is, relative movement between the plastic body 72 and the film 8 is provided such that the film 8 need not deflect in the same manner as the elastomer insert 90, and relative movement can occur between the film and the insert during the application of compressive loads. This reduces the stresses placed upon the adhesive and upon both the flexible film and the elastomer.

In order to properly interconnect the respective paths on the mother board 100 with the daughter board 110, the connector 2 must be properly aligned with the mother board 100 and the daughter board 100 must be properly aligned with the connector 2. The connector 2 is then aligned with the mother board by placing the connector over the conductive paths such that the alignment boss 10 is placed in the receiving hole 108, as shown in FIG. 6. In order to align the daughter board 110 with the connector 2, the daughter board is placed over the connector such that the receiving hole 54 is placed over the alignment boss 15 on the connector front surface 12b. As the alginment boss 15 and the alignment boss 10 are in the same vertical plane, the connector assures that the conductive paths 114 and 104 are concurrently aligned laterally.

The elastomeric insert 90 and the insert nodes 96 and 98 assure good contact between the conductive paths 6 and the condutive pads 114 and 104 for the electrical interconnection. As shown in FIG. 4, when the connector is secured to the printed circuit board by means of bolts 62 and 68 and nuts 64 and 70, the nodes 96, 98 are deformed inwardly and the resiliency in the elastomeric insert 90 produces a normal force on the backside of the film 4 forcing the conductive traces 6 outwardly against the conductive pad at point 6A, as best shown in FIGS. 3 and 4. Likewise, when the daughter board is secured to the connector by means of screw 50A and washer 52, and screw 50B, the elastomeric insert 90 and the insert node 96 produce a normal force on the backside of the conductive film 4 forcing the conductive traces 6 outwardly against the conductive pads at point 6B as best shown in FIGS. 3 and 4. When the connector 2 is securely attached to the mother board and the daughter board is securely attached to the connector, as shown in FIG. 4, the insert nodes 96 and 98 conform to the respective planes 78 and 86, the elastic deformation of the nodes producing a continuous normal force of the film 4 against the respective printed circuit boards.

FIG. 6 shows an alternate embodiment, rather than using a triangular insert 90, a cylindrical insert 190, circular in cross section, could be utilized. Furthermore, rather than retaining the film to the back surface 74 by means of an adhesive, the film could be overlapped and heat staked to the back surface by means of heat stakes 192.

FIG. 9 shows an alternate method of securing the daughter board to the connector. The connector has latches 250A and 250B for receiving a daughter board laterally of the face 212B and latching to the backside of the daughter board 110.

FIG. 10 shows a further embodiment for securing the daughter board to the connector. The daughter board is placed laterally of face 312b aligning boss 314 ith an alignment hole in the daughter card and heat staking pin 392 thus securing the daughter card to the connector.

What is claimed is:

1. An electrical connector for interconnecting circuitry on a first substrate to corresponding circuitry on a perpendicularlly mounted second substrate, each substrate having conductive elements disposed on one surface thereof as part of the circuitry on the substrate, the connector comprising:
   a body of cylindrical lengthwise configuration having a first mounting surface for mounting said first substrate thereto, and a second mounting surface perpendicular to said first mounting surface for mounting said second substrate thereto, said body further including a recess formed in the corner of the intersection of the first and second surfaces;
   means for mounting the first substrate to the connector;
   means for mounting the second substrate to the connector,
   an elastomeric insert disposed in said recess, said insert having a first node extending beyond and normal to said first mounting surface, and a second node extending beyond and normal to said second mounting surface,
   a flexible insulating film surrounding the elastomeric insert and at least a portion of the cylindrical body, said film having conductive traces disposed thereon,
   whereby, when the first substrate is mounted adjacent the first mounting surface and the second surface is moujted adjacent the second mounting surface, the first and second nodes are each resiliently deformed inwardly to a point planer with the respective first and second mounting surfaces, normally biasing the conductive traces on the film against the circuitry disposed on the substrates.

2. The connector of claim 1 wherein the centerline spacing between the conductive traces on the flexible insulating film is significantly less than the centerline spacing between the conductive elements disposed on the substrates.

3. The connector of claim 1 wherein the recess is a concave corner having a right angled cross-section.

4. The connector of claim 3 wherein the elastomeric insert is substantially a right triangle on its cross section, the right angle of the triangle disposed in the corner of the recess, the first and second nodes being formed by the remaining angles of the triangle.

5. The connector of claim 1 further comprising support members extending outwardly from the end of the cylindrical portion.

6. The connector of claim 5 wherein each support member comprises a bottom mating surface and a front mating surface.

7. The connector of claim 6 wherein the means for mounting the furst substrate to the connector comprises a hole extending through and normal to the bottom mating surface of said support members in alignment with holes in the first substrate, for receiving fastening means therethrough.

8. The connector of claim 6 wherein the means for mounting the second substrate to the connector comprises a hole extending into each front mating surface of the support members, internally threaded inserts interference fit in the holes, said inserts being in alignment with holes in said second substrate, for receiving a threaded member therein.

9. The connector of claim 1 wherein said recess comprises an axially extending angled surface extending between the first and second mounting surfaces of the cylindrical portion and an elastomeric insert, generally round in cross section, disposed within said recess.

10. The connector of claim 6 further comprising a first alignment means for aligning said connector with said conductive elements on said first substrate.

11. The connector of claim 10 wherein said first aligning means comprises a boss extending from the bottom mating surface of at least one support member, engageable with a mating counterbore in said first substrate.

12. The connector of claim 6 further comprising a second alignment means for aligning said connector with said conductive elements on said second substrate.

13. The connector of claim 12 wherein the second alignment means comprises a boss extending from the front mating portion of at least one support member, engageable with a mating counterbore in said second substrate.

14. The connector of claim 6 wherein the means for mounting the second substrate thereto comprises latch members extending from said support members securing the second substrate against the front mating face of the support members.

15. The connector of claim 6 wherein the means for attaching the second substrate thereto comprises heat stake members extending from the front mating face of said support member aligned with holes in the second substrate, for heat staking and securing the second subtrate to the front mating face.

* * * * *

UNITED STATES PATENT OFFICE
CERTIFICATE OF CORRECTION

Patent No. 4,693,529  Dated September 15, 1987

Inventor(s) Donald Gray Stillie

It is certified that error appears in the above-identified patent and that said Letters Patent are hereby corrected as shown below:

In claim 1, column 7, line 40, change "surface" to --substrate--.

In claim 1, column 7, line 40, change "moujted" to --mounted--.

In claim 7, column 8, line 11, change "furst" to --first--.

Signed and Sealed this

Nineteenth Day of April, 1988

Attest:

DONALD J. QUIGG

*Attesting Officer*   *Commissioner of Patents and Trademarks*